(12) United States Patent
Lee et al.

(10) Patent No.: US 9,349,536 B2
(45) Date of Patent: May 24, 2016

(54) MULTILAYER CERAMIC ELECTRONIC COMPONENT

(71) Applicant: SAMSUNG ELECTRO-MECHANICS CO., LTD., Suwon (KR)

(72) Inventors: Jong Ho Lee, Gyunggi-do (KR); Jae Yeol Choi, Gyunggi-Do (KR); Doo Young Kim, Gyunggi-Do (KR); Hang Kyu Cho, Gyunggi-Do (KR); Eung Soo Kim, Gyunggi-Do (KR); Byung Woo Han, Gyunggi-Do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 3 days.

(21) Appl. No.: 13/715,974

(22) Filed: Dec. 14, 2012

(65) Prior Publication Data

US 2014/0125194 A1    May 8, 2014

(30) Foreign Application Priority Data

Nov. 7, 2012  (KR) .......................... 10-2012-0125174

(51) Int. Cl.
*H01G 4/30* (2006.01)
*H01G 4/012* (2006.01)
(Continued)

(52) U.S. Cl.
CPC ................ *H01G 2/103* (2013.01); *H01G 4/012* (2013.01); *H01G 4/232* (2013.01); *H01G 4/30* (2013.01); *H01L 41/0472* (2013.01); *H01L 41/0533* (2013.01); *H01G 4/12* (2013.01)

(58) Field of Classification Search
CPC ........... H01G 4/12; H01G 4/30; H01G 4/232; H01G 4/005; H01G 4/008
USPC .................... 361/306.3, 321.2, 303
See application file for complete search history.

(56) References Cited

U.S. PATENT DOCUMENTS 4,771,520 A * 9/1988 Tanaka et al. ................ 29/25.42
6,159,768 A * 12/2000 Ahn .............................. 438/107

(Continued)

FOREIGN PATENT DOCUMENTS

EP        0777242 A2    6/1997
EP        2078762 A1    7/2009

(Continued)

OTHER PUBLICATIONS

Japanese Office Action with Full English Translation issued in Japanese Patent Application No. 2012-272815 mailed Oct. 1, 2013.

(Continued)

*Primary Examiner* — David M Sinclair
(74) *Attorney, Agent, or Firm* — McDermott Will & Emery LLP

(57) ABSTRACT

A multilayer ceramic electronic component includes: a ceramic body including dielectric layers; an oxide film formed on one surface of the ceramic body; first and second external electrodes formed on both sides of the oxide film on one surface of the ceramic body; a first internal electrode formed on the dielectric layer and including a first electrode lead-out portion exposed to the first external electrode and a first insulating lead-out portion exposed to the oxide film and having a composite-metal-oxide region formed in an exposed edge portion thereof; a second internal electrode facing the first internal electrode, having the dielectric layer interposed therebetween, and including a second electrode lead-out portion exposed to the second external electrode and a second insulating lead-out portion exposed to the oxide film, having a composite-metal-oxide region formed in an exposed edge portion thereof, and overlapped with the first insulating lead-out portion to form additional capacitance.

18 Claims, 11 Drawing Sheets

(51) Int. Cl.

| | |
|---|---|
| *H01G 4/232* | (2006.01) |
| *H01G 4/005* | (2006.01) |
| *H01G 4/008* | (2006.01) |
| *H01G 2/10* | (2006.01) |
| *H01L 41/047* | (2006.01) |
| *H01L 41/053* | (2006.01) |
| *H01G 4/12* | (2006.01) |

(56) References Cited

U.S. PATENT DOCUMENTS

| | | | |
|---|---|---|---|
| 6,903,919 B2* | 6/2005 | Kayatani et al. | 361/321.2 |
| 7,054,137 B1* | 5/2006 | Barber et al. | 361/321.1 |
| 7,123,467 B2* | 10/2006 | Greier et al. | 361/321.2 |
| 7,341,639 B2* | 3/2008 | Greier et al. | 156/89.12 |
| 8,194,388 B2* | 6/2012 | Koppel et al. | 361/303 |
| 8,584,348 B2* | 11/2013 | Wei | 29/602.1 |
| 2003/0099084 A1* | 5/2003 | Duva | 361/306.3 |
| 2006/0139848 A1 | 6/2006 | Kim et al. | |
| 2008/0304204 A1* | 12/2008 | Suzuki | 361/321.3 |
| 2010/0206624 A1* | 8/2010 | Feichtinger | 174/260 |
| 2011/0157768 A1* | 6/2011 | Hur et al. | 361/321.2 |

FOREIGN PATENT DOCUMENTS

| | | | |
|---|---|---|---|
| JP | 2000-306765 A | | 11/2000 |
| JP | 2006013384 A | * | 1/2006 |
| JP | 2006-196811 A | | 7/2006 |
| JP | 2009026872 A | * | 2/2009 |
| JP | 2009-054973 A | | 3/2009 |
| JP | 2011-023707 A | | 2/2011 |
| KR | 10-0202500 B1 | | 6/1999 |
| KR | 10-0587006 B1 | | 6/2006 |

OTHER PUBLICATIONS

Korean Office Action with Full English Translation issued in Korean Patent Application No. 10-2012-0125174 mailed Dec. 23, 2013.
Examination Report dated Aug. 11, 2014 issued in the corresponding Taiwanese Patent Application No. 101147769.
First Office Action issued Jan. 4, 2016, in related Chinese Application No. 2013-10011832.9 (English translation provided).

* cited by examiner

B-B'

C1-C1'

C2-C2'

A-A'

A-A'

B-B'

C1-C1'

C2-C2'

A-A'

B-B'

MULTILAYER CERAMIC ELECTRONIC COMPONENT

CROSS-REFERENCE TO RELATED APPLICATIONS

This application claims the priority of Korean Patent Application No. 10-2012-0125174 filed on Nov. 7, 2012, in the Korean Intellectual Property Office, the disclosure of which is incorporated herein by reference.

BACKGROUND OF THE INVENTION

1. Field of the Invention

The present invention relates to a multilayer ceramic electronic component having excellent capacitance and low equivalent series inductance (ESL), and being easily mounted on a circuit board.

2. Description of the Related Art

Generally, electronic components using a ceramic material, such as a capacitor, an inductor, a piezoelectric element, a varistor, or a thermistor, and the like, include a ceramic body formed of a ceramic material, internal electrodes formed within the ceramic body, and external electrodes mounted on surfaces of the ceramic body so as to be connected to the internal electrodes.

Among ceramic electronic components, a multilayer ceramic capacitor includes a plurality of laminated dielectric layers, internal electrodes disposed to face each other, having the dielectric layer interposed therebetween, and external electrodes electrically connected to the internal electrodes.

The multilayer ceramic capacitor has been widely used as a component for mobile communications devices such as computers, personal digital assistants (PDAs), mobile phones, and the like, due to advantages such as a relatively small size, high capacity, ease of mounting, or the like.

Recently, as electronic products have been miniaturized and multi-functionalized, chip components have also tended to be miniaturized and multi-functionalized. As a result, there is a need to miniaturize the multilayer ceramic capacitor and increase the capacitance thereof.

In addition, the multilayer ceramic capacitor has been usefully employed as a bypass capacitor disposed in a power supply circuit in a large scale integration (LSI) scheme. The multilayer ceramic capacitor needs to have a capability of effectively removing high frequency noise in order to serve as the bypass capacitor. This demand has been further increased in accordance with the trend toward electronic devices having high frequencies. A multilayer ceramic capacitor used as a bypass capacitor may be electrically connected to a mounting pad on a circuit board through soldering, and the mounting pad may be connected to other external circuits through wiring patterns or conductive vias on the circuit board.

The multilayer ceramic capacitor has equivalent series resistance (ESR) and equivalent series inductance (ESL) components in addition to a capacitance component. These ESR and ESL components hinder a function of the bypass capacitor, particularly, the ESL increases inductance of the capacitor at high frequencies, to thereby hinder high frequency noise removal characteristics.

RELATED ART DOCUMENT (Patent Document 1) Japanese Patent Laid-Open Publication No. JP 2011-023707

SUMMARY OF THE INVENTION

An aspect of the present invention provides a multilayer ceramic electronic component having excellent capacitance and low equivalent series inductance (ESL), and being easily mounted on a circuit board.

According to an aspect of the present invention, there is provided a multilayer ceramic electronic component including: a ceramic body including dielectric layers; an oxide film formed on one surface of the ceramic body; first and second external electrodes formed on both sides of the oxide film on one surface of the ceramic body; a first internal electrode formed on the dielectric layer and including a first electrode lead-out portion exposed to the first external electrode and a first insulating lead-out portion exposed to the oxide film and having a composite metal oxide region formed in an exposed edge portion thereof; and a second internal electrode disposed to face the first internal electrode, having the dielectric layer interposed therebetween, and including a second electrode lead-out portion exposed to the second external electrode and a second insulating lead-out portion exposed to the oxide film, having a composite metal oxide region formed in an exposed edge portion thereof, and overlapped with the first insulating lead-out portion to form additional capacitance.

The oxide film may entirely cover a region in which the first and second insulating lead-out portions are overlapped with each other.

The multilayer ceramic electronic component may further include an insulating layer disposed on the oxide film.

The insulating layer may be formed between the first external electrode and the second external electrode.

The first and second internal electrodes may be exposed to one surface of the ceramic body in the width direction.

The first and second internal electrodes may be disposed perpendicularly with regard to a mounting surface of the ceramic body.

The first and second external electrodes may be formed on one surface of the ceramic body in a width direction and extended to one surface or the other surface of the ceramic body in a thickness direction.

The multilayer ceramic electronic component may further include an insulating layer covering both of the oxide film and portions of the first and second external electrodes formed on one surface of the ceramic body in the width direction.

The first and second internal electrodes may be disposed in parallel with regard to a mounting surface of the ceramic body.

The oxide film may include at least one selected from a group consisting of magnesium (Mg), manganese (Mn), silicon (Si), and cobalt (Co).

The oxide film may include at least one selected from a group consisting of manganese oxide (MnO), manganese dioxide ($MnO_2$), dimanganese trioxide ($Mn_2O_3$), trimanganese tetraoxide ($Mn_3O_4$), and magnesium oxide (MgO).

The composite metal oxide region may contain Ni—Mg—O, Ni—Mn—O, or Ni—Mg—Mn—O.

The insulating layer may include organic resin, ceramic, inorganic filler, glass, or a mixture thereof.

According to another aspect of the present invention, there is provided a multilayer ceramic electronic component including: a ceramic body including dielectric layers; first and second internal electrodes having first and second lead-out portions having an overlapped region and exposed to one surface of the ceramic body, respectively; an oxide film covering the overlapped region of the first and second lead-out portions; and first and second external electrodes connected to the first and second lead-out portions and formed on both sides of the oxide film, respectively; wherein the first and second lead-out portions have composite metal oxide regions formed in edge portions thereof, covered with the oxide film.

The multilayer ceramic electronic component may further include an insulating layer disposed on the oxide film.

According to another aspect of the present invention, there is provided a multilayer ceramic electronic component including: a ceramic body including dielectric layers; a first internal electrode formed on the dielectric layer and exposed to one surface of the ceramic body in a length direction and one surface and the other surface of the ceramic body opposing each other in a width direction; a second internal electrode disposed to face the first internal electrode, having the dielectric layer interposed therebetween, and exposed to the other surface of the ceramic body in the length direction and one surface and the other surface thereof in the width direction; an oxide film disposed on one surface and the other surface of the ceramic body in the width direction; a first external electrode electrically connected to the first internal electrode; and a second external electrode electrically connected to the second internal electrode, wherein the first and second internal electrodes have composite metal oxide regions formed in edge portions thereof exposed to one surface and the other surface in the width direction.

The multilayer ceramic electronic component may further include an insulating layer disposed on the oxide film.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
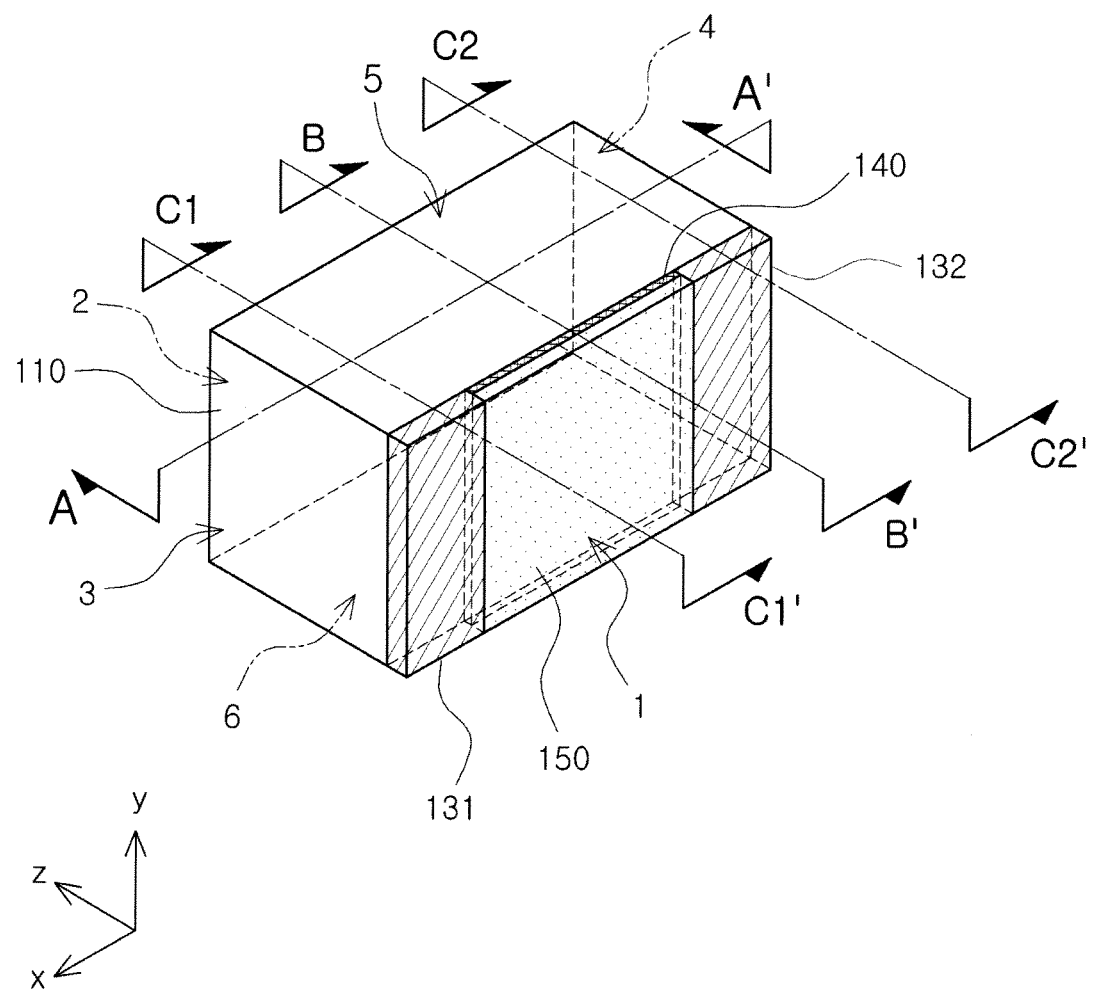
FIG. 1 is a schematic perspective view showing a multilayer ceramic electronic component according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of components may be exaggerated for clarity, and the same reference numerals will be used throughout to designate the same or like components.

Figure 2:
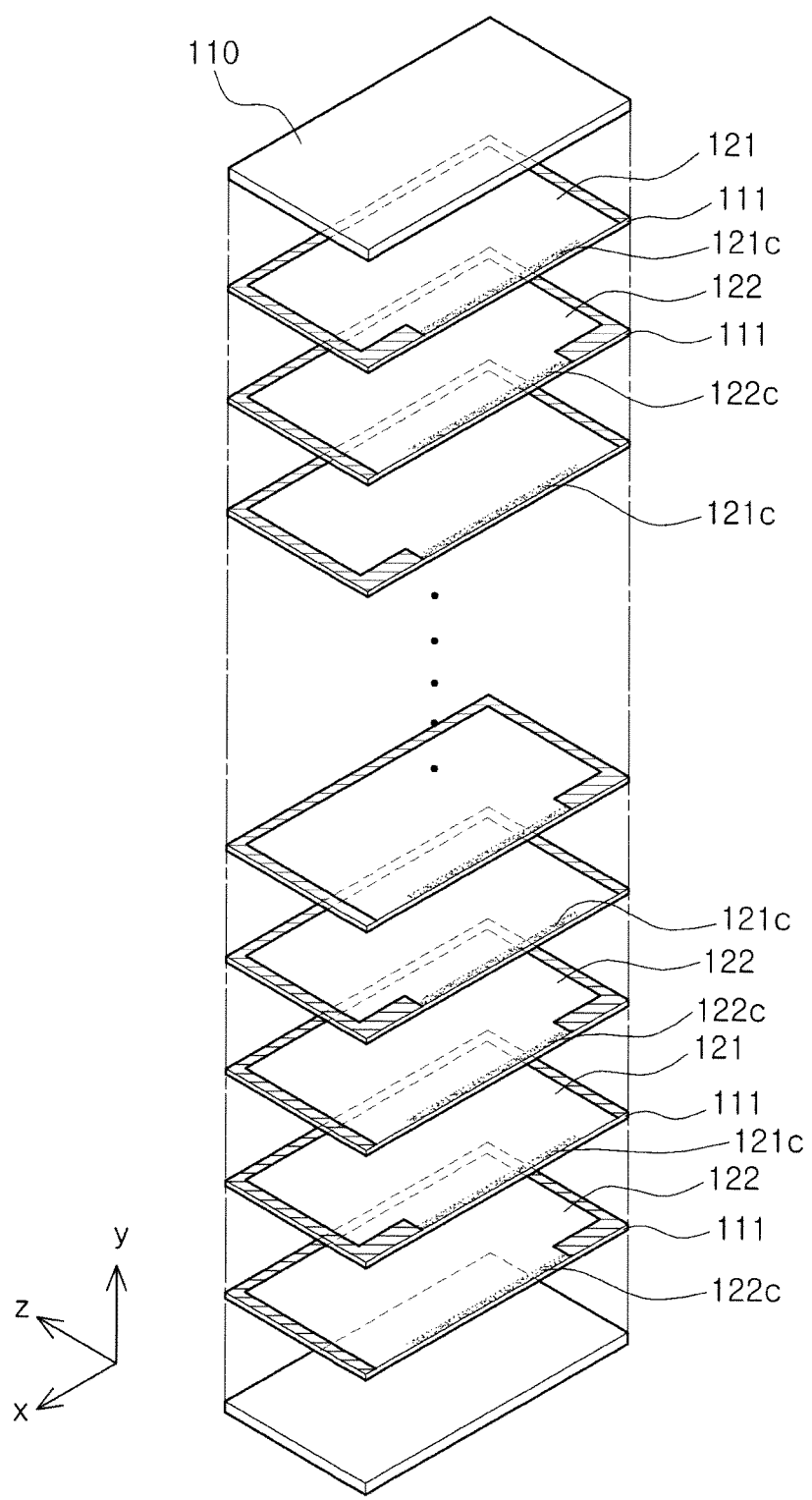
FIG. 2 is an exploded perspective view of a ceramic body of FIG. 1.

FIG. 1 is a schematic perspective view showing a multilayer ceramic electronic component according to an embodiment of the present invention; and FIG. 2 is an exploded perspective view of a ceramic body of FIG. 1.

Figure 3A:
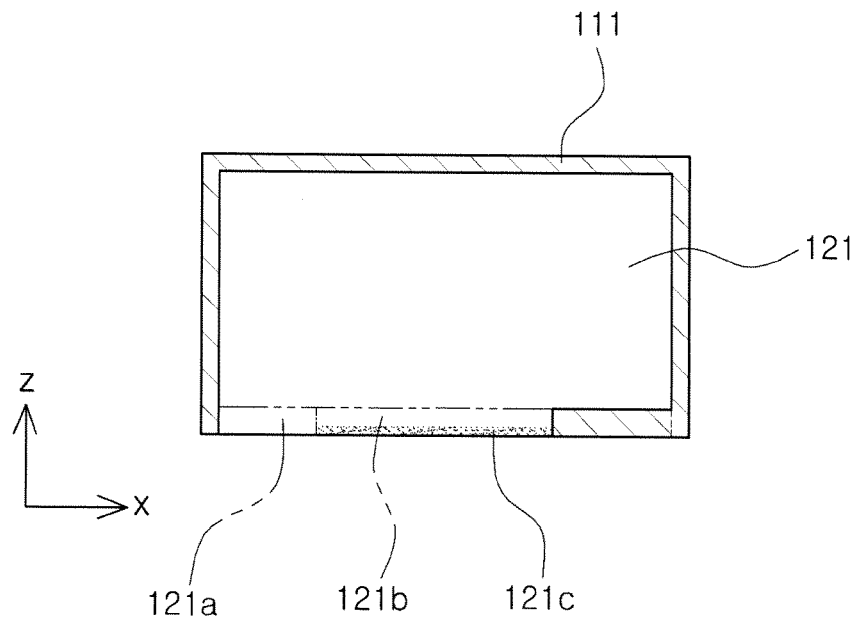
FIGS. 3A and 3B are cross-sectional views showing a structure of internal electrodes of the multilayer ceramic electronic component shown in FIG. 1.
Figure 3B:
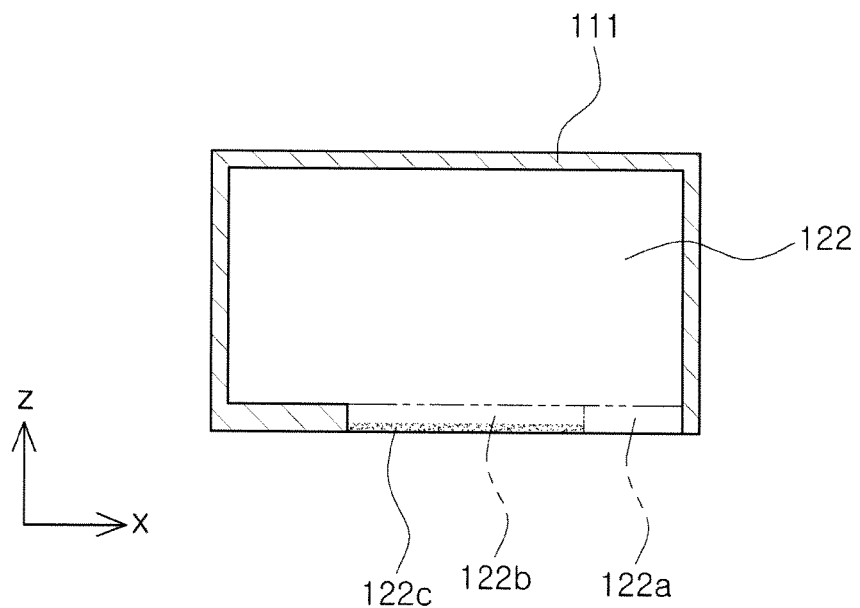

FIGS. 3A and 3B are cross-sectional views showing a structure of internal electrodes of the multilayer ceramic electronic component shown in FIG. 1.

Figure 4A:
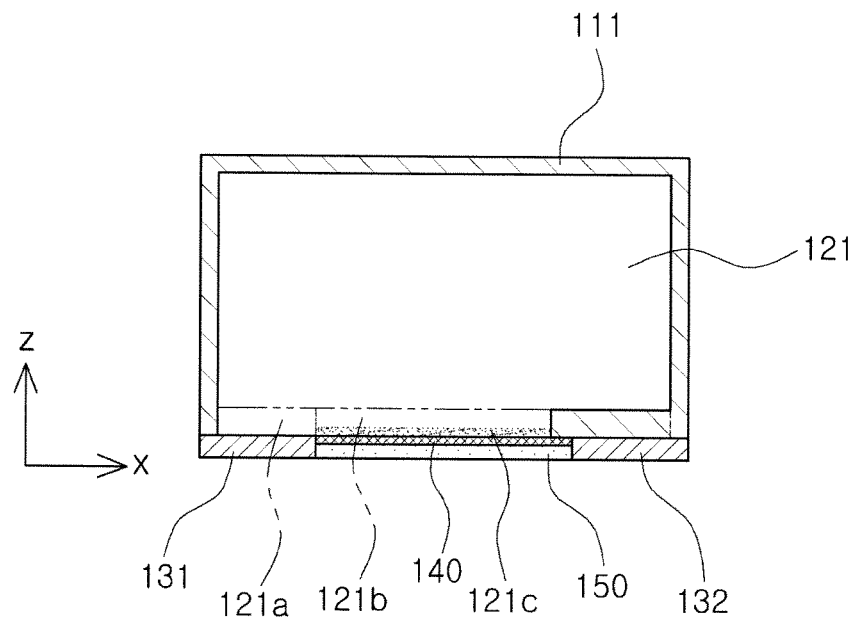
FIGS. 4A and 4B are cross-sectional views taken along line A-A' of FIG. 1.
Figure 4B:
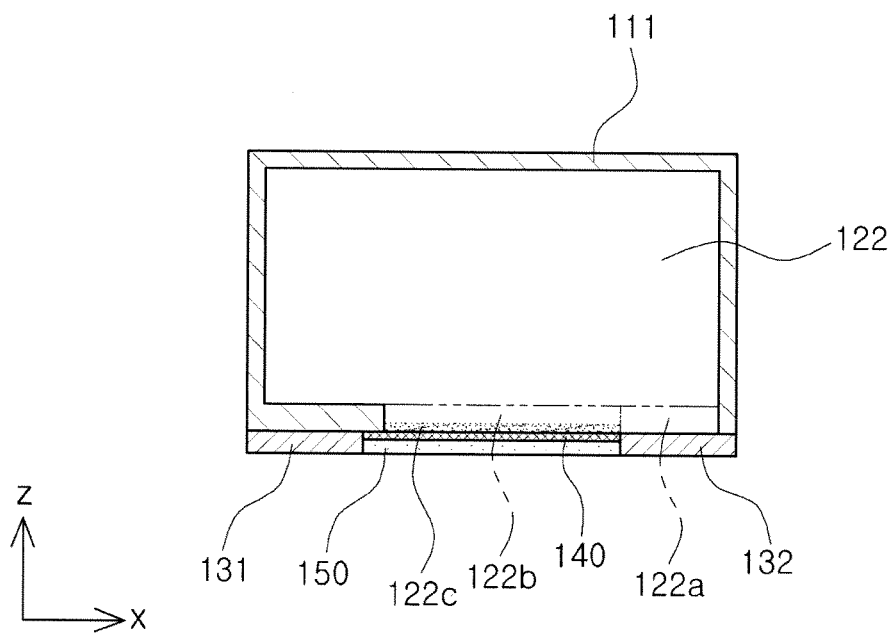
Figure 5:
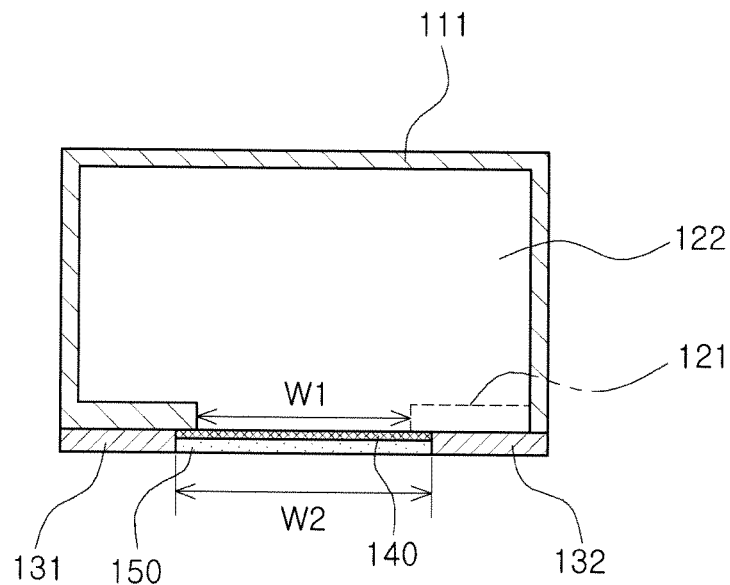
FIG. 5 is a projected cross-sectional view taken along line A-A' of FIG. 1.
Figure 6:
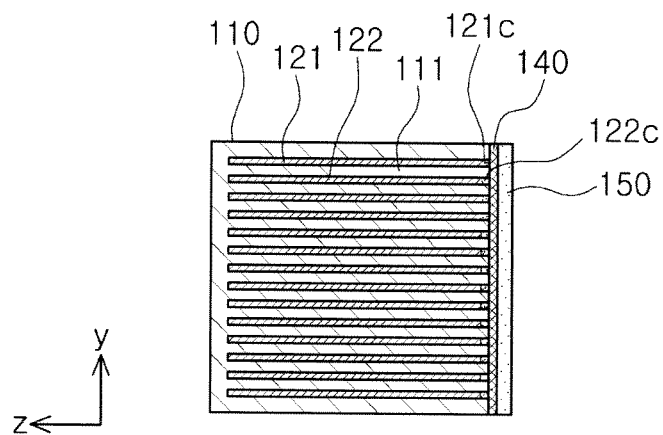
FIG. 6 is a cross-sectional view taken along line B-B' of FIG. 1.
Figure 7:
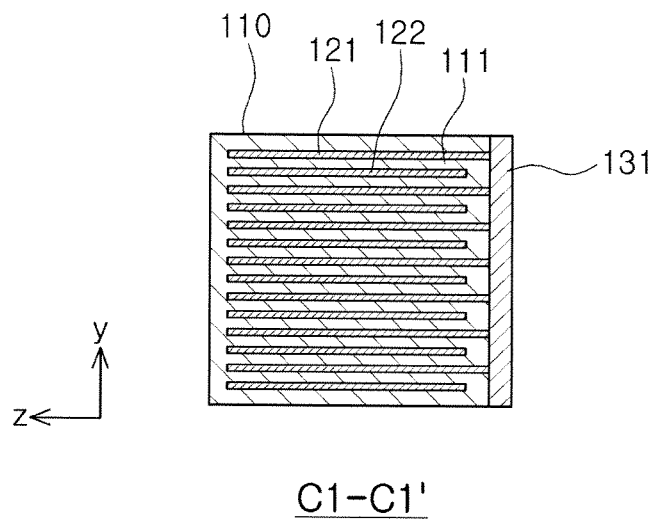
FIG. 7 is a cross-sectional view taken along line C1-C1' of FIG. 1.
Figure 8:
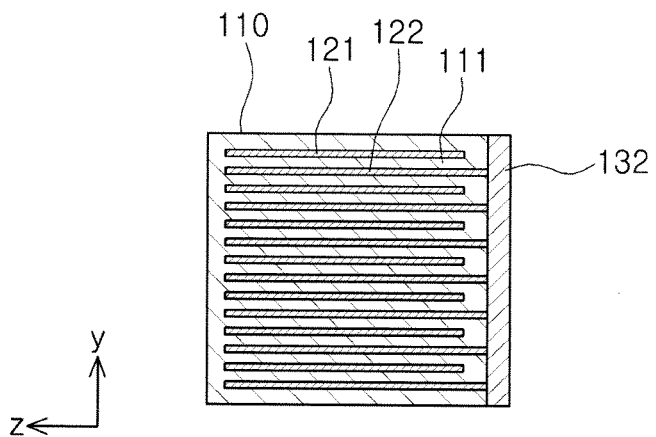
FIG. 8 is a cross-sectional view taken along line C2-C2' of FIG. 1.

FIGS. 4A and 4B are cross-sectional views taken along line A-A' of FIG. 1; FIG. 5 is a projected cross-sectional view taken along line A-A' of FIG. 1; and FIGS. 6 through 8 are cross-sectional views taken along line B-B', line C1-C1', and line C2-C2' of FIG. 1.

Referring to FIGS. 1 through 8, the multilayer ceramic electronic component according to the embodiment of the present invention may include a ceramic body 110 including dielectric layers 111, internal electrodes 121 and 122 formed on the dielectric layers 111; and an oxide film 140 formed on one surface of the ceramic body 110; and external electrodes 131 and 132.

The ceramic body 110 may have a hexahedral shape. At the time of firing a chip, due to firing shrinkage of a ceramic powder, the ceramic body 110 may have a substantially hexahedral shape, even though it may not have a hexahedral shape having perfectly straight lines.

Directions of the hexahedron will be defined in order to clearly explain the embodiments of the present invention. X, Y and Z directions, shown in FIG. 1, represent a length direction, a thickness direction, and a width direction, respectively. Here, the thickness direction may be used to have the same meaning as a direction in which the dielectric layers are stacked.

In the embodiment of the present embodiment, the ceramic body 110 may have a first surface 1 and a second surface 2 opposing each other in the width direction, a third surface 3 and a fourth surface 4 opposing each other in the length direction, and a fifth surface 5 and a six surface 6 opposing each other in the thickness direction.

According to the embodiment of the present invention, the ceramic body 110 may be formed by stacking a plurality of dielectric layers 111. The plurality of dielectric layers 111 configuring the ceramic body 110 are in a sintered state and may be integrated such that boundaries therebetween may not be readily apparent.

The dielectric layer 111 may be formed by firing a ceramic green sheet containing a ceramic powder, an organic solvent, and an organic binder. As the ceramic powder, a high k material, a barium titanate ($BaTiO_3$)-based material, a strontium titanate ($SrTiO_3$)-based material, or the like, may be used. However, the ceramic powder is not limited thereto.

According to the embodiment of the present invention, the internal electrodes 121 and 122 may be formed on the dielectric layers 111 within the ceramic body 110. FIGS. 3A and 3B are cross-sectional views showing the dielectric layers 111 configuring the ceramic body 110 and the internal electrodes 121 and 122 formed on the dielectric layers 111, and FIGS. 4A and 4B are cross-sectional views taken along line A-A' of FIG. 1.

According to the embodiment of the present invention, the first internal electrode 121 having a first polarity and the second internal electrode 122 having a second polarity may be formed in pairs and may be disposed to face each other, having one dielectric layer 111 interposed therebetween, and be stacked in the thickness direction.

According to the embodiment of the present invention, the first and second internal electrodes may be formed of a conductive paste including a conductive metal. The conductive metal may be Ni, Cu, Pd, or an alloy thereof, but is not limited thereto.

An internal electrode layer may be printed on a ceramic green sheet forming the dielectric layer 111 using a conductive paste through a printing method such as a screen printing method or a gravure printing method, but is not limited thereto. The ceramic green sheets having the internal electrode layers printed thereon may be alternately stacked and fired to thereby form the ceramic body 110.

Referring to FIGS. 3A, 3B, 4A, and 4B, the first and second internal electrodes may include first lead-out portions 121a and 121b and second lead-out portions 122a and 122b exposed to the first surface 1 of the ceramic body 110, respectively. The first lead-out portions 121a and 121b may include a first electrode lead-out portion 121a connected to the external electrode and a first insulating lead-out portion 121b not connected to the external electrode. The second lead-out portions 122a and 122b may include a second electrode lead-out portion 122a connected to the external electrode and a second insulating lead-out portion 122b overlapped with the first insulating lead-out portion 121b and not connected to the external electrode.

Generally, the first and second internal electrodes form capacitance in an overlapped region thereof, and the lead-out portions connected to the external electrodes having opposite polarities do not have the overlapped region. However, according to the embodiment of the present invention, additional capacitance may be formed by including the overlapped region in which the first and second lead-out portions, more specifically, the first and second insulating lead-out portions 121b and 122b are overlapped with each other.

Referring to FIGS. 4A and 4B, the first and second external electrodes 131 and 132 having opposite polarities may be formed on both sides of the oxide film 140.

The first external electrode 131 may be formed to be connected to the first electrode lead-out portion 121a of the first internal electrode 121 exposed to the first surface of the ceramic body 110, and the second external electrode 132 may be formed to be connected to the second electrode lead-out portion 122a of the second internal electrode 122 exposed to the first surface of the ceramic body 110.

The first external electrode 131 may be connected to a region of the first lead-out portions, not overlapped with the second lead-out portions, and the second external electrode 132 may be connected to a region of the second lead-out portions, not overlapped with the first lead-out portions.

The first external electrode 131 may be connected to a portion of the first lead-out portions so as not to contact the second lead-out portions, and the second external electrode 132 may be connected to a portion of the second lead-out portions so as not to contact the first lead-out portions.

The oxide film 140 may be formed on the first surface of the ceramic body 110 so as to cover the entire overlapped region in which the first and second lead-out portions are overlapped with each other. As shown in FIG. 5, the oxide film 140 may have a length slightly greater than that of the overlapped region in order to prevent an electrical short-circuit between the first and second internal electrodes 121 and 122. That is, when a length of the overlapped region of the first and second lead-out portions is W1, and a length of the oxide film 140 is W2, W2 may be greater than W1.

In addition, although not shown, according to the embodiment of the present invention, the oxide film 140 may be formed to cover the overlapped region between the first and second lead-out portions, and it may have predetermined intervals from the first and second external electrodes 131 and 132.

Examples of a method of forming the oxide film 140 may include a slurry coating method, a dried film adhesion method, a transfer method, and the like. However, the method of forming the oxide film 140 is not particularly limited as long as the oxide film 140 may be adhered to one surface of the ceramic body 110 to which the internal electrode is exposed.

The oxide film 140 may include all components which are solidified into a metal included in the internal electrode to form a composite oxide having a higher degree of resistance than that of the metal included in the internal electrode. For example, the oxide film may include at least one selected from a group consisting of magnesium (Mg), manganese (Mn), silicon (Si), and cobalt (Co), but is not limited thereto.

In addition, the oxide film 140 may be formed of at least one selected from a group consisting of manganese oxide (MnO), manganese dioxide ($MnO_2$), dimanganese trioxide ($Mn_2O_3$), trimanganese tetraoxide ($Mn_3O_4$), and magnesium oxide (MgO), but is not limited thereto.

The oxide film 140 covers exposed edge portions of the first and second insulating lead-out portions 121b and 122b to thereby form composite metal oxide regions 121c and 122c in the edge portions of the first and second insulating lead-out portions 121b and 122b contacting the oxide film 140. The composite metal oxide regions 121c and 122c may be formed by solidifying the component of the oxide film 140 into the metal forming the internal electrode. More specifically, the composite metal oxide region formed in the first insulating lead-out portion 121b may be a first composite metal oxide region 121c, and the composite metal oxide region formed in the second insulating lead-out portion 122b may be a second composite metal oxide region 122c.

The composite metal oxide regions 121c and 122c may be formed of Ni—Mg—O, Ni—Mn—O, or Ni—Mg—Mn—O; however, they are not limited thereto but may be variously formed of a combination of the metal forming the internal electrode and the components included in the oxide film 140.

The composite metal oxide regions 121c and 122c may be formed on the oxide film 140, and the composite metal oxide regions 121c and 122c may be integrated with the oxide film 140, such that a boundary therebetween may not be clearly discernible. The oxide film 140 does not have to be thick, and a thickness thereof is enough as long as it is sufficient to form the composite metal oxide regions 121c and 122c by reacting with the internal electrode.

In the case in which the oxide film 140 is excessively thinly coated, the components of the oxide film 140 and the composite metal oxide regions 121c and 122c may be the same.

In addition, the oxide film 140 is shown as a complete plane without a curve in drawings; however, it may have a disconnected portion or a curved surface due to a reaction with the internal electrode.

Further, the multilayer ceramic electronic component according to the embodiment of the present invention may further include an insulating layer 150 formed between the first and second external electrodes 131 and 132 and covering the oxide film 140. The insulating layer 150 is not limited but may include organic resin, ceramic, inorganic filler, glass, or a mixture thereof.

As in the present embodiment, in the case in which the first and second external electrodes 131 and 132 are formed on the first surface of the ceramic body 110 and the insulating layer 150 is disposed between the first and second external electrodes 131 and 132, the first surface of the ceramic body 110 may become a mounting surface, and the first and second internal electrodes 121 and 122 may be disposed perpendicularly with regard to the mounting surface, that is, the first surface 1, of the multilayer ceramic electronic component.

According to the embodiment of the present invention, the overlapped region is even partially formed between the lead-out portions of the first and second internal electrodes, whereby capacitance of the multilayer ceramic electronic component may be increased. In addition, since the first and second internal electrodes to which external polarities are applied are close to each other, a current loop may be shortened, and accordingly, equivalent series inductance (ESL) may be lowered.

The oxide film may prevent an electrical short circuit between the internal electrodes by covering the lead-out portions of the internal electrodes exposed to one surface of the ceramic body and overlapped with each other. In addition, the composite metal oxide region formed by applying the oxide film may effectively prevent internal defects such as deterioration of moisture-proof properties, and the like, together with the oxide film, and prevent reliability deterioration in the exposed edge portions of the internal electrode.

Further, the reliability of the multilayer ceramic electronic component may be significantly improved by additionally applying the insulating layer thereto, and a thickness of the insulating layer may be appropriately controlled in accordance with required properties.

In addition, as in the present embodiment, in the case in which the external electrodes are formed on one surface of the multilayer ceramic electronic component, the multilayer ceramic electronic component may be easily mounted on a circuit board and mounting density thereon may be improved.

Figure 9:
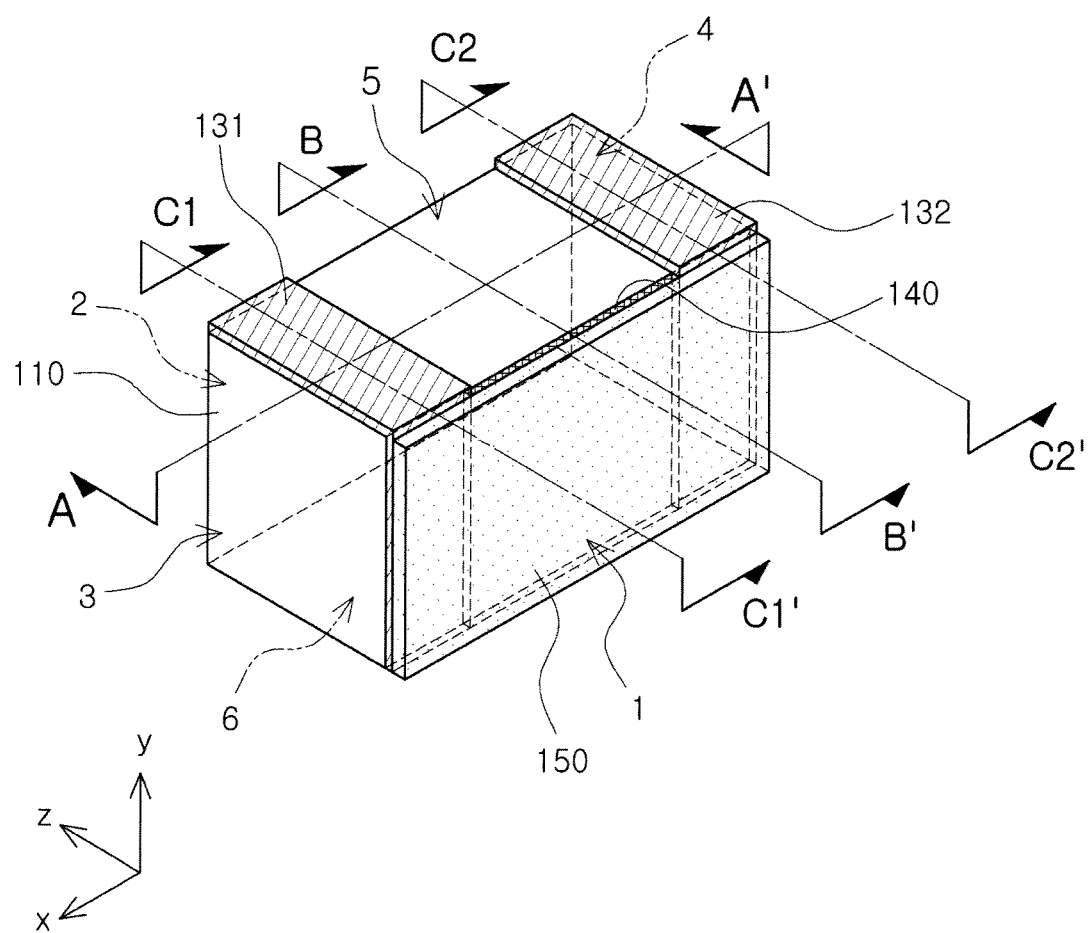
FIG. 9 is a perspective view showing a multilayer ceramic electronic component according to another embodiment of the present invention.
Figure 10A:
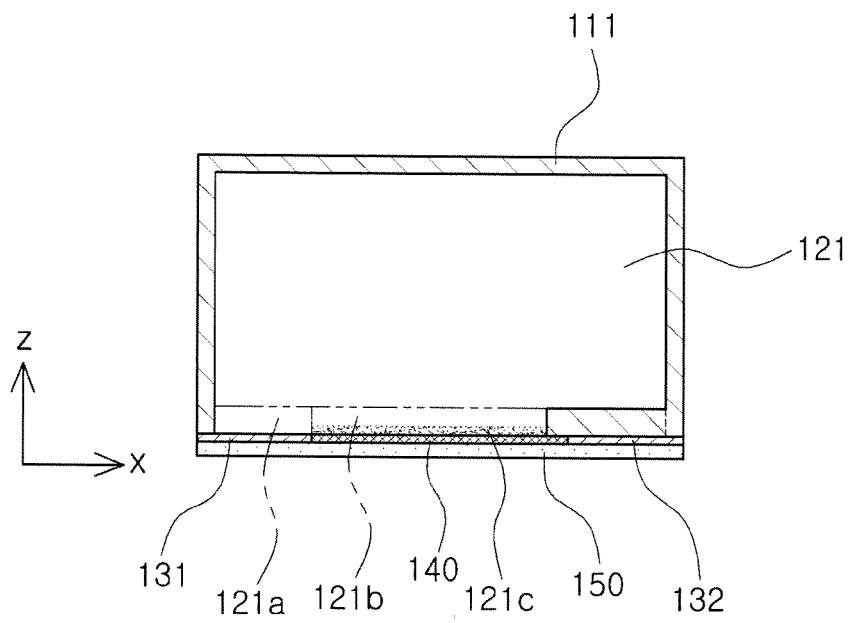
FIGS. 10A and 10B are cross-sectional views taken along line A-A' of FIG. 9.
Figure 10B:
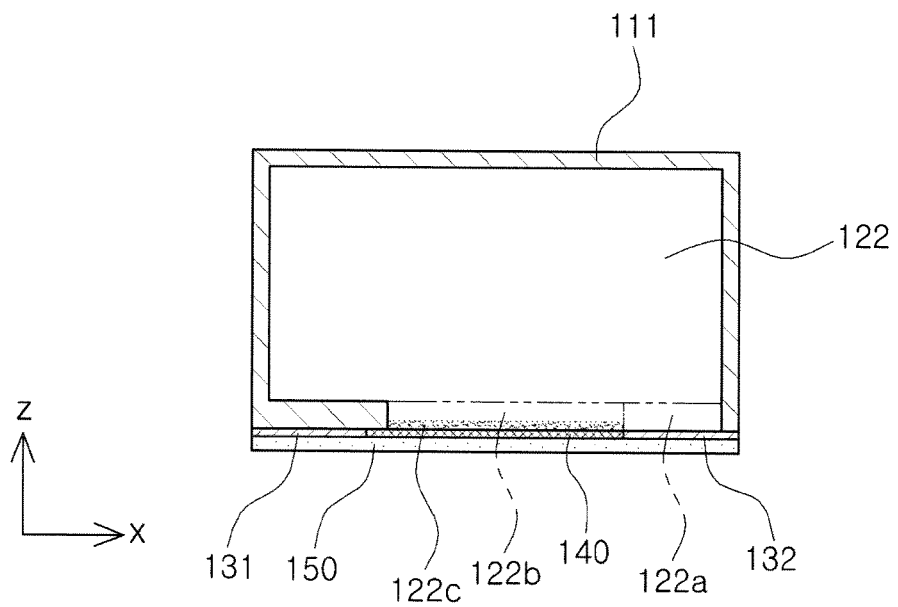
Figure 11:
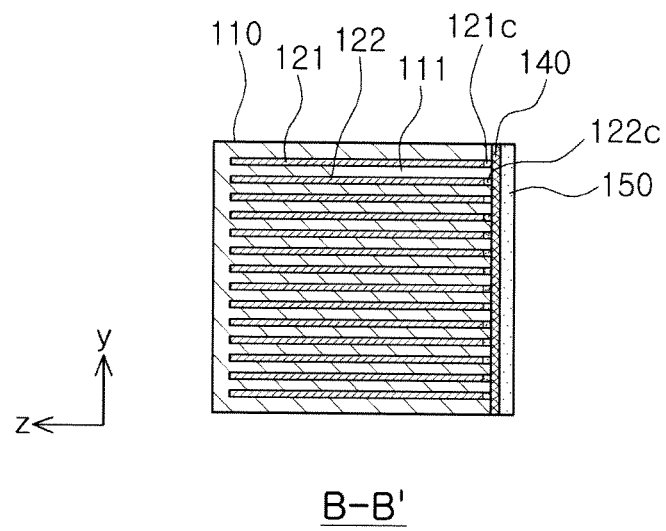
FIG. 11 is a cross-sectional view taken along line B-B' of FIG. 9.
Figure 12:
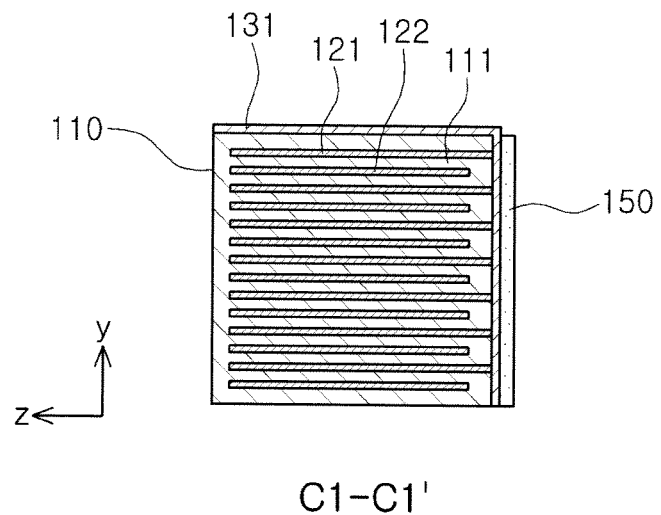
FIG. 12 is a cross-sectional view taken along line C1-C1' of FIG. 9.
Figure 13:
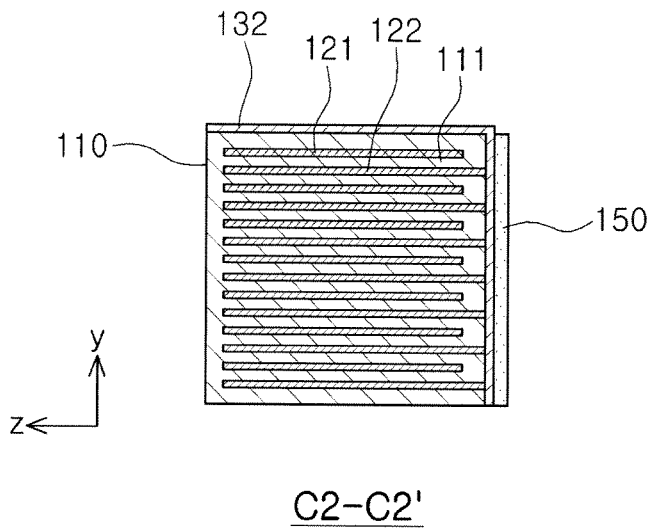
FIG. 13 is a cross-sectional view taken along line C2-C2' of FIG. 9.

FIGS. 9 through 13 show a multilayer ceramic electronic component according to another embodiment of the present invention. FIG. 9 is a perspective view showing a multilayer ceramic electronic component according to the present embodiment; FIGS. 10A and 10B are cross-sectional views taken along line A-A' of FIG. 9; and FIGS. 11 through 13 are cross-sectional views taken along line B-B' of FIG. 9, line C1-C1' of FIG. 9, and line C2-C2' of FIG. 9, respectively. Hereinafter, components different from those of the above-mentioned embodiment may be mainly described and detailed descriptions of the same components and effects will be omitted.

According to the present embodiment shown in FIGS. 9 through 13, the first and second external electrodes 131 and 132 formed on the first surface may be extended to one surface or the other surface of the ceramic body 110 in the thickness direction.

In this case, the insulating layer 150 may cover the oxide film 140 between the first and second external electrodes 131 and 132; however, the insulating layer 150 may cover both the oxide film 140 and portions of the first and second external electrodes 131 and 132 formed on the first surface of the ceramic body 110.

In the case in which the first and second external electrodes 131 and 132 are extended to one surface or the other surface of the ceramic body 110 in the thickness direction as described above, one surface (the fifth surface) or the other surface (the sixth surface) of the ceramic body 110 in the thickness direction may be a mounting surface, and the first and second internal electrodes may be disposed in parallel with regard to the mounting surface of the multilayer ceramic electronic component. That is, the first and second internal electrodes may be parallelly mounted on the multilayer ceramic electronic component.

Although not shown, in the embodiments of the present invention, the internal electrodes 121 and 122 may be exposed to at least one surface among the first surface 1, the second surface 2, the third surface 3, and the fourth surface 4 of the ceramic body 110, and surfaces to which the internal electrodes are exposed may be provided with the oxide film. In addition, the composite metal oxide region may be formed in exposed edge portions of the internal electrode lead-out portions, and the composite metal oxide region may be formed on the oxide film. Further, the insulating layer may be further provided on the oxide film.

Since descriptions of the composite metal oxide region, the oxide film, and the insulating layer are overlapped with the above descriptions, the overlapped descriptions will be omitted, and the number of surfaces to which the internal electrodes are exposed, positions thereof, expansion structures and positions of the external electrodes, and the like, may be variously changed by those skilled in the art.

Figure 14:
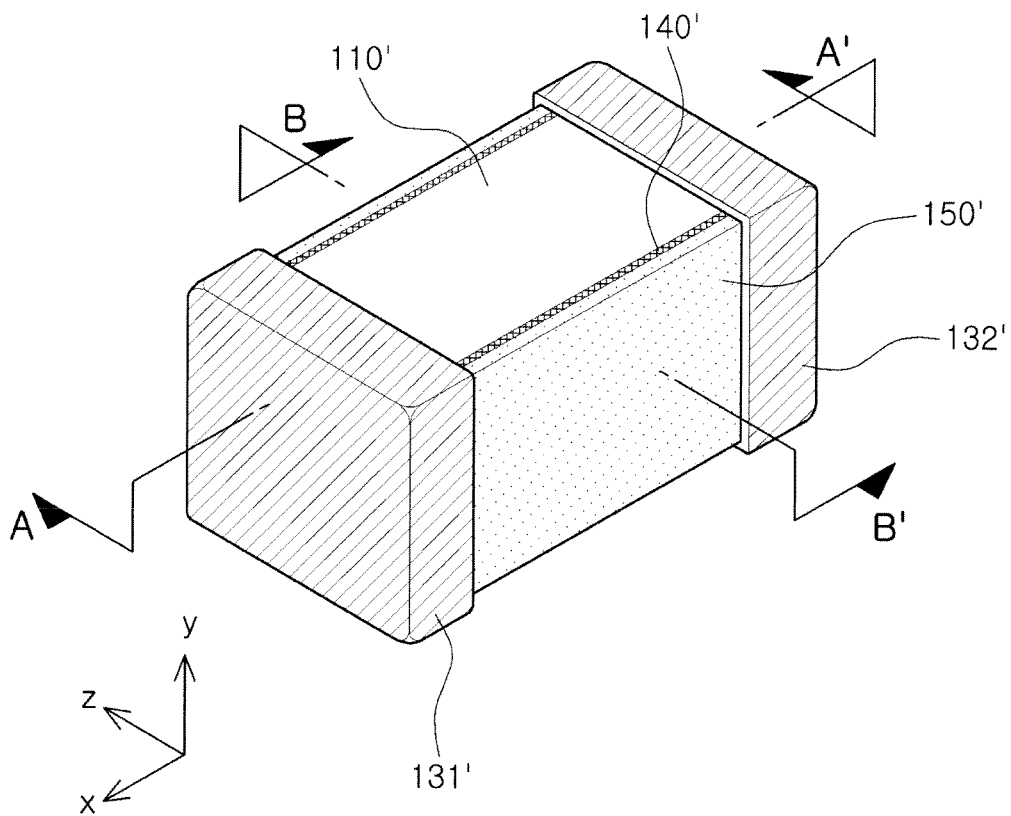
FIG. 14 is a perspective view showing a multilayer ceramic electronic component according to another embodiment of the present invention.
Figure 15:
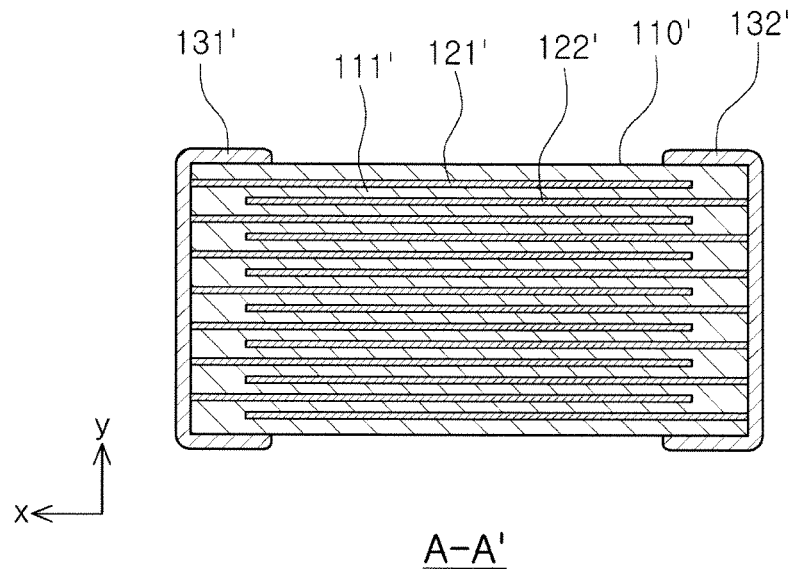
FIG. 15 is a cross-sectional view taken along line A-A' of FIG. 14.
Figure 16:
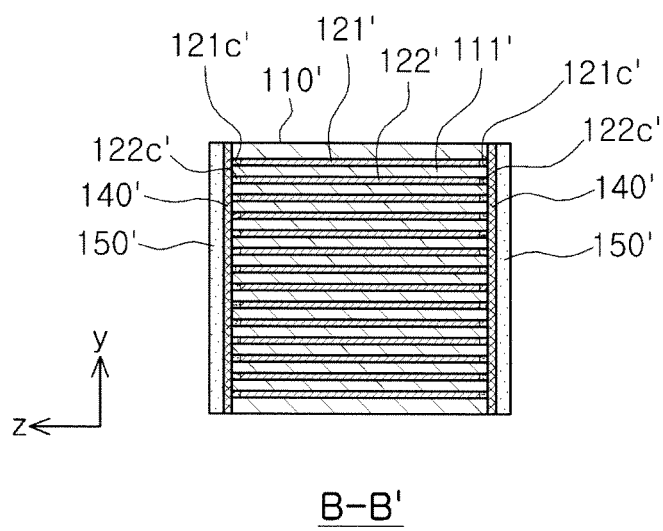
FIG. 16 is a cross-sectional view taken along line B-B' of FIG. 14.

FIGS. 14 through 16 show a multilayer ceramic electronic component according to another embodiment of the present invention. FIG. 14 is a perspective view showing a multilayer ceramic electronic component according to another embodiment of the present invention, and FIGS. 15 and 16 are cross-sectional views taken along line A-A' of FIG. 14 and line B-B' of FIG. 14, respectively. Hereinafter, components different from those of the above-mentioned embodiment may be mainly described and detailed descriptions of the same components and effects will be omitted.

Referring to FIGS. 14 through 16, according to another embodiment of the present invention, a multilayer ceramic electronic component may include: a ceramic body 110' including dielectric layers 111'; a first internal electrode formed on the dielectric layer 111' and exposed to one surface of the ceramic body 110' in a length direction, and one surface and the other surface of the ceramic body opposing each other in a width direction; a second internal electrode disposed to face the first internal electrode, having the dielectric layer 111' interposed therebetween, and exposed to the other surface of the ceramic body 110' in the length direction opposing one surface thereof in the length direction, and one surface and the other surface thereof in the width direction; an oxide film 140' disposed on one surface and the other surface of the ceramic body 110' in the width direction; a first external electrode 131' electrically connected to the first internal electrode; and a second external electrode 132' electrically connected to the second internal electrode.

The first and second external electrodes 131' and 132' may be formed on different surfaces in the present embodiment, unlike the above-described embodiment in which the first and second external electrodes are formed on the same surface. That the multilayer ceramic electronic component in the present embodiment may have the first and second external electrodes formed on one surface and the other surface opposing to each other in the length direction.

In the present embodiment, the first internal electrode 121' may include a first electrode lead-out portion 121a' and a first insulating lead-out portion 121b', and the second internal electrode 122' may include a second electrode lead-out portion 122a' and a second insulating lead-out portion 122b'.

The first electrode lead-out portion 121a' connected to the first external electrode 131' may be exposed to one surface of the ceramic body 110' in the length direction, and the first insulating lead-out portion 121b' contacting the oxide film 140' may be exposed to one surface and the other surface of the ceramic body 110' opposing each other in the width direction. The second electrode lead-out portion 122a' connected to the second external electrode 132' may be exposed to the other surface of the ceramic body 110' in the length direction, and the second insulating lead-out portion 122b' contacting the oxide film 140' may be exposed to one surface and the other surface of the ceramic body 110' opposing each other in the width direction, like the first insulating lead-out portion 121b'.

Composite metal oxide regions 121c' and 122c' may be formed in edge portions of the first and second insulating lead-out portions 121b' and 122b' contacting the oxide film 140'.

In addition, an insulating layer 150' may be further provided on the oxide film 140'.

As set forth above, according to embodiments of the present invention, a multilayer ceramic capacitor having excellent capacitance and low equivalent series inductance (ESL) and being easily mounted on a circuit board may be provided.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component comprising:
 a ceramic body including dielectric layers;
 an oxide film formed on one surface of the ceramic body;
 first and second external electrodes formed on both sides of the oxide film on one surface of the ceramic body;
 a first internal electrode formed on the dielectric layer and including a first electrode main portion, a first electrode lead-out portion extending from a side of the first electrode main portion and exposed to the first external electrode, and a first insulating lead-out portion extending from the first electrode main portion and exposed to the oxide film and having a composite metal oxide region formed in an exposed edge portion thereof;
 a second internal electrode disposed to face the first internal electrode, having the dielectric layer interposed therebetween, and including a second electrode main portion, a second electrode lead-out portion extending from a side of the second electrode main portion and exposed to the second external electrode, and a second insulating lead-out portion extending from the second electrode main portion and exposed to the oxide film, having a composite metal oxide region formed in an exposed edge portion thereof, and overlapped with the first insulating lead-out portion to form additional capacitance;
 at least one of a first margin portion extending from the side of the first electrode main portion or a second margin portion extending from the side of the second electrode main portion; and
 an insulating layer disposed on the oxide film,
 wherein an exposed end of the first electrode lead-out portion and an exposed end of the first insulating lead-out portion are disposed on a substantially straight line, and an exposed end of the second electrode lead-out portion and an exposed end of the second insulating lead-out portion are disposed on a substantially straight line, and
 wherein the oxide film is a composition different than that of the insulating layer.

2. The multilayer ceramic electronic component of claim 1, wherein the oxide film entirely covers a region in which the first and second insulating lead-out portions are overlapped with each other.

3. The multilayer ceramic electronic component of claim 1, wherein the insulating layer is formed between the first external electrode and the second external electrode.

4. The multilayer ceramic electronic component of claim 1, wherein the first and second internal electrodes are exposed to one surface of the ceramic body in the width direction.

5. The multilayer ceramic electronic component of claim 1, wherein the first and second internal electrodes are disposed perpendicularly with regard to a mounting surface of the ceramic body.

6. The multilayer ceramic electronic component of claim 1, wherein the first and second external electrodes are formed on one surface of the ceramic body in a width direction and extended to one surface or the other surface of the ceramic body in a thickness direction.

7. The multilayer ceramic electronic component of claim 6, wherein the insulating layer covers both of the oxide film and portions of the first and second external electrodes formed on one surface of the ceramic body in the width direction.

8. The multilayer ceramic electronic component of claim 6, wherein the first and second internal electrodes are disposed in parallel with regard to a mounting surface of the ceramic body.

9. The multilayer ceramic electronic component of claim 1, wherein the oxide film includes at least one selected from a group consisting of magnesium (Mg), manganese (Mn), silicon (Si), and cobalt (Co).

10. The multilayer ceramic electronic component of claim 1, wherein the oxide film includes at least one selected from a group consisting of manganese oxide (MnO), manganese dioxide ($MnO_2$), dimanganese trioxide ($Mn_2O_3$), trimanganese tetraoxide ($Mn_3O_4$), and magnesium oxide (MgO).

11. The multilayer ceramic electronic component of claim 1, wherein the composite metal oxide region contains Ni—Mg—O, Ni—Mn—O, or Ni—Mg—Mn—O.

12. The multilayer ceramic electronic component of claim 1, wherein the insulating layer includes at least one of an organic resin, a ceramic material, an inorganic filler, or glass, or mixtures thereof.

13. The multilayer ceramic electronic component of claim 1, wherein the oxide film includes components of a composite oxide in the first and second internal electrodes.

14. The multilayer ceramic electronic component of claim 1, wherein at least one of the first internal electrode or the second internal electrode includes a cut-out space, and
 wherein the cut-out space of the at least one of the first internal electrode or the second internal electrode is arranged adjacent to the first insulating lead-out portion or the second insulating lead-out portion, respectively.

15. A multilayer ceramic electronic component comprising:
 a ceramic body including dielectric layers;
 first and second internal electrodes having first and second electrode main portions, respectively, and first and second lead-out portions extending from a side of the first and second electrode main portions and having an overlapped region and exposed to one surface of the ceramic body, respectively;

an oxide film covering the overlapped region of the first and second lead-out portions;

first and second external electrodes connected to the first and second lead-out portions and formed on both sides of the oxide film, respectively;

at least one of a first margin portion extending from the side of the first electrode main portion or a second margin portion extending from the side of the second electrode main portion; and an insulating layer disposed on the oxide film, wherein the first and second lead-out portions have composite metal oxide regions formed in edge portions thereof, covered with the oxide film, wherein an exposed end of the first lead-out portion and an exposed end of a first insulating lead-out portion are disposed on a substantially straight line, and an exposed end of the second lead-out portion and an exposed end of a second insulating lead-out portion are disposed on a substantially straight line, and wherein the oxide film is a composition different than that of the insulating layer.

16. The multilayer ceramic electronic component of claim 15, wherein the insulating layer includes at least one of an organic resin, a ceramic material, an inorganic filler, or glass, or mixtures thereof.

17. The multilayer ceramic electronic component of claim 15, wherein the oxide film includes components of a composite oxide in the first and second internal electrodes.

18. The multilayer ceramic electronic component of claim 15, wherein at least one of the first internal electrode or the second internal electrode includes a cut-out space, and wherein the cut-out space of the at least one of the first internal electrode or the second internal electrode is arranged adjacent to the first insulating lead-out portion or the second insulating lead-out portion, respectively.

* * * * *